(12) United States Patent
Zaal et al.

(10) Patent No.: US 7,492,440 B2
(45) Date of Patent: Feb. 17, 2009

(54) LITHOGRAPHIC APPARATUS AND DEVICE MANUFACTURING METHOD

(75) Inventors: Koen Jacobus Johannes Maria Zaal, Eindhoven (NL); Edwin Johan Buis, Belfeld (NL); Henrikus Herman Marie Cox, Eindhoven (NL); Noud Jan Gilissen, Eindhoven (NL); Harmen Klaas Van Der Schoot, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 230 days.

(21) Appl. No.: 10/936,712

(22) Filed: Sep. 9, 2004

(65) Prior Publication Data

US 2006/0049698 A1    Mar. 9, 2006

(51) Int. Cl.
G02B 27/52 (2006.01)
G02B 27/42 (2006.01)
H02K 41/00 (2006.01)

(52) U.S. Cl. .................. 355/53; 250/492.2; 355/72; 310/12

(58) Field of Classification Search .................. 310/12; 355/53, 72; 250/492.1, 492.2
See application file for complete search history.

(56) References Cited

U.S. PATENT DOCUMENTS

| | | | | |
|---|---|---|---|---|
| 4,887,904 A * | 12/1989 | Nakazato et al. | ............ | 356/621 |
| 5,280,677 A * | 1/1994 | Kubo et al. | ............ | 33/568 |
| 6,509,951 B2 * | 1/2003 | Loopstra et al. | ............ | 355/30 |
| 6,533,947 B2 * | 3/2003 | Nasiri et al. | ............ | 216/2 |
| 6,724,466 B2 * | 4/2004 | Ono et al. | ............ | 355/72 |
| 6,760,358 B1 * | 7/2004 | Zimmermann et al. | ...... | 372/101 |
| 6,788,386 B2 * | 9/2004 | Cox et al. | ............ | 355/53 |
| 6,949,844 B2 * | 9/2005 | Cahill et al. | ............ | 310/12 |
| 7,126,674 B2 * | 10/2006 | Butler | ............ | 355/72 |
| 2001/0035686 A1 * | 11/2001 | Hwang et al. | ............ | 310/12 |
| 2002/0131682 A1 * | 9/2002 | Nasiri et al. | ............ | 385/18 |
| 2003/0030782 A1 * | 2/2003 | Watson et al. | ............ | 355/72 |
| 2003/0058425 A1 * | 3/2003 | Watson et al. | ............ | 355/72 |
| 2004/0004703 A1 * | 1/2004 | Hazelton | ............ | 355/72 |
| 2004/0212794 A1 * | 10/2004 | Mizuno | ............ | 355/72 |
| 2005/0089774 A1 * | 4/2005 | Choi et al. | ............ | 430/22 |
| 2005/0275311 A1 * | 12/2005 | Choi et al. | ............ | 310/323.05 |

* cited by examiner

*Primary Examiner*—Burton Mullins
(74) *Attorney, Agent, or Firm*—Pillsbury Winthrop Shaw Pittman LLP

(57) ABSTRACT

A substrate or a patterning device used in a lithographic apparatus and a lithographic device manufacturing method are presented. The substrate and patterning device are aligned with respect to a patterning beam and are movably supported by a support. Resonances in said support, however, may render the manufactured device unusable and/ or may render the control system complex. Therefore an actuator assembly frame with flexible coupling devices coupled to the support is provided with a number of actuators configured to move the support in a number of degrees of freedom. Thus, the resonances are damped by the flexible coupling devices resulting in a larger bandwidth for the control system and thus enabling a better position accuracy of the support.

22 Claims, 6 Drawing Sheets

PRIOR ART

LITHOGRAPHIC APPARATUS AND DEVICE MANUFACTURING METHOD

BACKGROUND

1. Field of the Invention

The present invention relates to lithographic apparatus and methods.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

For stepping or scanning of the patterning device or the substrate, a support structure for supporting the patterning device or the substrate may be coupled to a number of actuators. The actuators may control the support structure in six degrees of freedom, i.e. in three linear directions (x, y, z) and in three rotational directions (Rx, Ry, Rz). The actuators position and move the patterning device or the substrate in the six directions accurately with respect to each other and with respect to the projection beam in order to prevent irradiation errors, which errors may render the scanned substrate unusable.

The support system including the support structure and the number of actuators and its connections to other structures determines the dynamical properties of the system. For example, the support system may be characterized by mechanical eigen frequencies determined by the mass and inertia properties of the actuators and the support structure and their connections. A servo control system controlling the support system is designed by taking into account these dynamical properties.

Generally, flexible coupling devices such as leaf springs may be used between an actuator assembly including a first set of actuators for moving the support structure in a plane, for example in the x,y-plane, and a second set of actuators may be used for moving the support structure substantially perpendicularly with respect to said plane, e.g. x,y-plane, wherein each actuator of the second set is separately coupled to the support structure by flexible coupling devices, such as leaf springs. However, in such a configuration of the actuator assembly of the first set of actuators and the second set of separately coupled actuators, it is desirable to have a high horizontal stiffness of the attachment of the second set of actuators to the support structure to minimize cross talk to the horizontal direction. It may be difficult to design such an actuator coupling with a high horizontal stiffness and a vertical stiffness with desirable dynamical properties. Further, the dynamical properties may be predetermined during design of the support system such that the dynamical properties may be beneficial for the servo control of the support system, by enabling a high servo bandwidth that results in a high position accuracy.

SUMMARY

Embodiments of the invention include an actuator configuration configured to move an object such as the above-described support structure or substrate table in at least six degrees of freedom, the actuator configuration providing predetermined dynamical properties in each degree of freedom, i.e. direction.

According to an embodiment of the invention, there is provided a lithographic apparatus including an illumination system configured to condition a radiation beam; a pattern support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus further includes an actuator assembly constructed to support and move the substrate table or the pattern support with respect to a base structure, the actuator assembly including: an actuator assembly frame; flexible coupling devices configured to flexibly couple the actuator assembly to the substrate table or the pattern support, and at least one actuator coupling the actuator assembly frame to the support structure, the at least one actuator being configured to move the substrate table or the pattern support in three degrees of freedom in a plane and at least one other degree of freedom.

In another embodiment of the invention, there is provided a lithographic apparatus including an illumination system configured to condition a radiation beam; a pattern support configured to support a patterning device, the patterning device being configured to impart the radiation beam with a pattern in its cross-section to form a patterned radiation beam; a substrate support constructed to hold a substrate; a projection system configured to project the patterned radiation beam onto a target portion of the substrate; and an actuator assembly configured to move one of the supports with respect to a base structure, the actuator assembly including an actuator assembly frame; a flexible coupling assembly configured to flexibly couple the actuator assembly frame to the one support, and at least one actuator coupling the actuator assembly frame to the base structure, the at least one actuator being configured to move the one support in three degrees of freedom in a plane and at least one other degree of freedom.

According to a further embodiment of the invention, there is provided an apparatus including an actuator assembly constructed to support and move an object, the actuator assembly including: an actuator assembly frame; flexible coupling devices configured to flexibly couple the actuator assembly frame to the object, and at least one actuator coupling the actuator assembly frame to a base structure, the at least one actuator being configured to move the object in three degrees of freedom in a plane and at least one other degree of freedom.

A device manufacturing method according to an embodiment of the invention includes patterning a beam of radiation with a pattern in its cross-section; projecting the patterned beam of radiation onto a target portion of a substrate; and supporting a slide member over a running surface of a base, the supporting including: flexibly coupling an actuator assembly to the slide member; and exerting a supporting force from the actuator assembly onto the running surface; wherein the actuator assembly is configured to filter supporting forces that act to space apart the slide member from the running surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
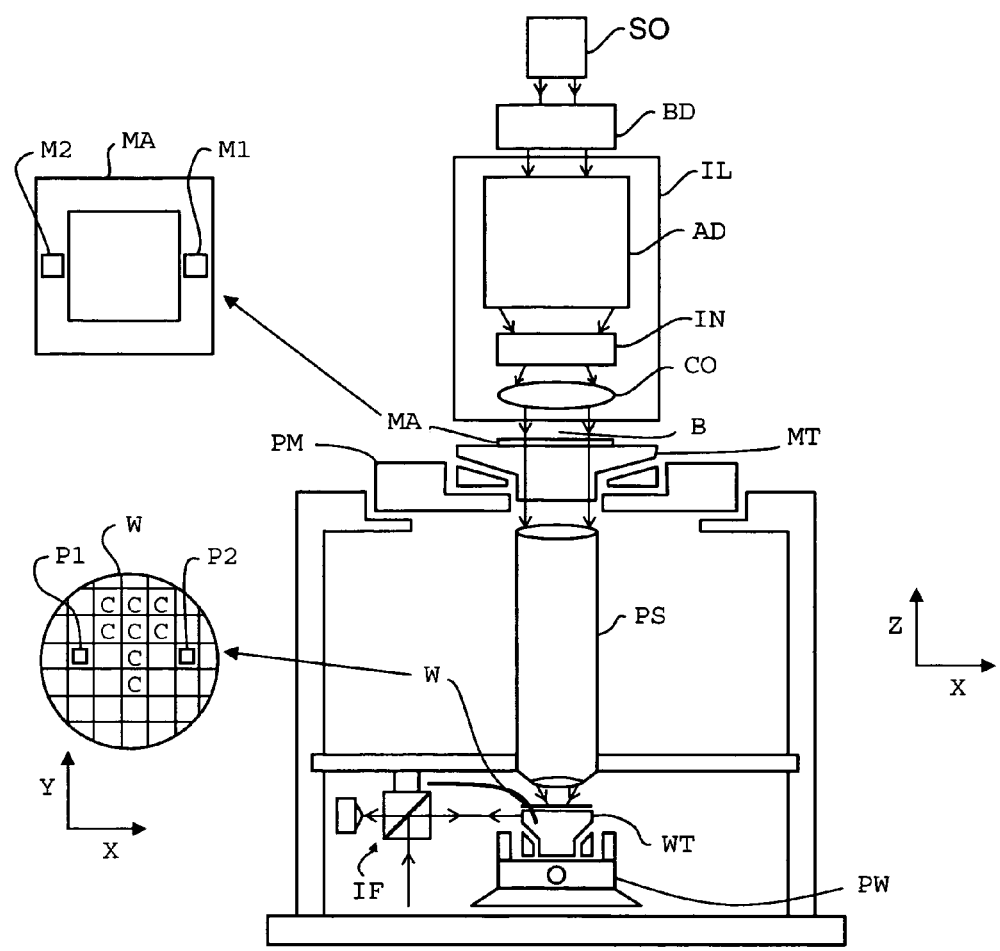
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT or "mask support" may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT "substrate table" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2A:
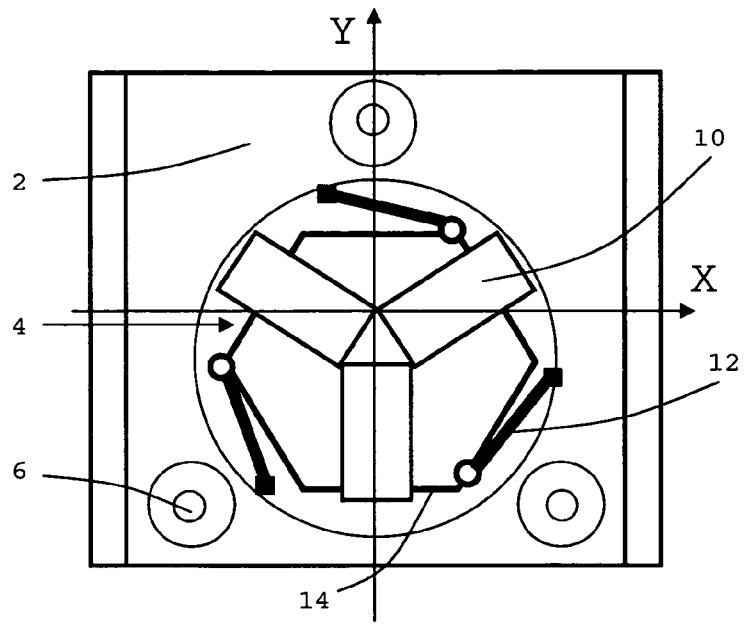
FIG. 2A shows a schematical top view of a conventional actuator assembly configured to move an object in six degrees of freedom.
Figure 2B:
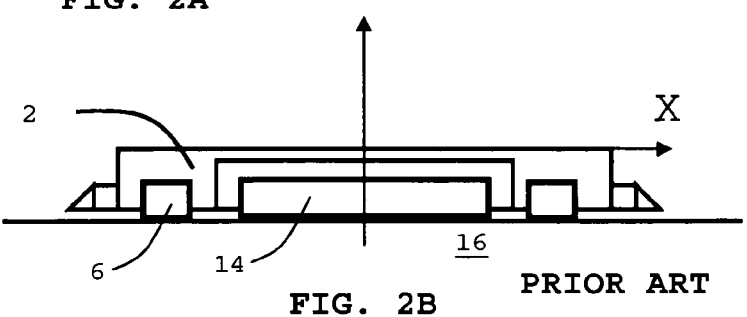
FIG. 2B shows a schematical side view of the conventional actuator assembly of FIG. 2A.

FIGS. 2A and 2B schematically depict a conventional actuator configured to move and support an object 2, such as a pattern support or a substrate table or "substrate support", in six degrees of freedom. The object position is measured using position sensors between a frame (e.g. the projection system) and the object itself (these sensors are not shown in the figure). The object 2 is coupled to an actuator assembly 4 with a flexible coupling assembly including flexible coupling members 12, and to a second set of actuators 6, which second actuators 6 are separately coupled to the object 2 either directly (e.g. glued) or by using flexible coupling devices (not shown). The actuator assembly 4 includes a first set of actuators 10 configured to move the object 2 substantially parallel to a plane of the actuators 10 in three degrees of freedom, i.e. in two translational directions and one rotational direction. The second actuators 6 may move the object 2 substantially perpendicular to the plane independently of each other, thereby enabling to move the object 2 to shift towards or away from the plane, but also, if not all second actuators 6 are actuated simultaneously, to rotate the object 2 with respect to the plane. Further, the actuators 6, 10 are coupled to a base structure 16. Thus, it is possible to move the object 2 in six degrees of freedom with respect to the base structure 16. It is noted that moving the object 2 with respect to the base structure 16 is intended to position the object 2 with respect to another structure or system, for example with respect to the projection system of the lithographic apparatus or a beam of radiation in the lithographic apparatus as described in relation to FIG. 1.

Referring to FIGS. 2A and 2B again, the flexible coupling members 12, the object 2 and the actuator assembly 4 and their coupling to the base structure 16 form a mechanical system that may be characterized by its dynamical properties. For example, a first part of the first actuators 10, e.g. a coil assembly, is coupled to the base structure and a second part, e.g. a magnet assembly, is coupled to an actuator assembly frame 14. The flexible coupling members 12 couple the actuator assembly frame 14 to the object 2. The flexible coupling members 12 may be springs, e.g. leaf springs, pneumatic support devices or hydraulic support devices such as air mounts. The second actuators 6 couple the base structure 16 and the object 2 directly. This conventional configuration of the object 2, the actuator assembly 4 and the second set of actuators 6 has undesirable dynamical properties with respect to the servo control of the object 2.

Figure 2C:
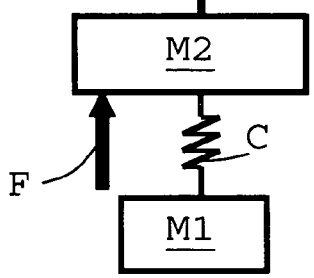
FIG. 2C shows a simplified representation of the conventional actuator assembly of FIG. 2B.

FIG. 2C illustrates a representation of the conventional assembly of FIGS. 2A and 2B. The object 2, which is to be controlled, is represented by mass M2, the actuator assembly 4 by mass M1, and the flexible coupling devices therebetween by compliance C. Further, the force F on mass M2 represents the coupling between the actuator assembly 4 and the base structure 16 due to the second actuators 6. The undesirable dynamical properties of such a configuration are explained in relation to FIG. 4 hereinafter.

In the conventional actuator configuration of FIGS. 2A-C, there is a relatively large center of gravity mismatch, i.e. a difference in the calculated center of gravity of the structure to be moved and the actual center of gravity thereof. The center of gravity mismatch requires that the set of second actuators must be put at a large radius with respect to the center of gravity to provide a suitable torque required during large in-plane acceleration and deceleration of the structure to position the structure at a desired location.

Figure 3A:
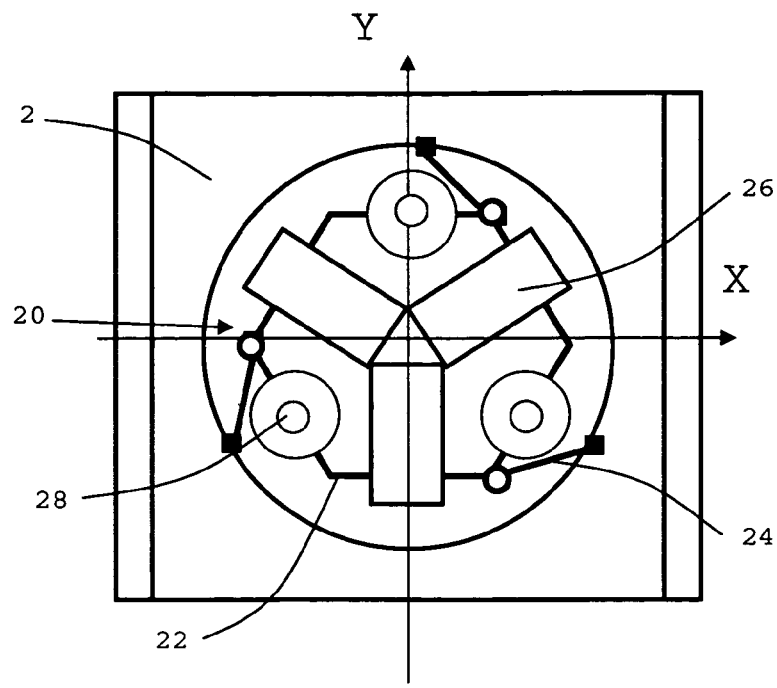
FIG. 3A shows a schematical top view of an actuator assembly configured to move an object in six degrees of freedom according to an embodiment of the present invention.
Figure 3B:
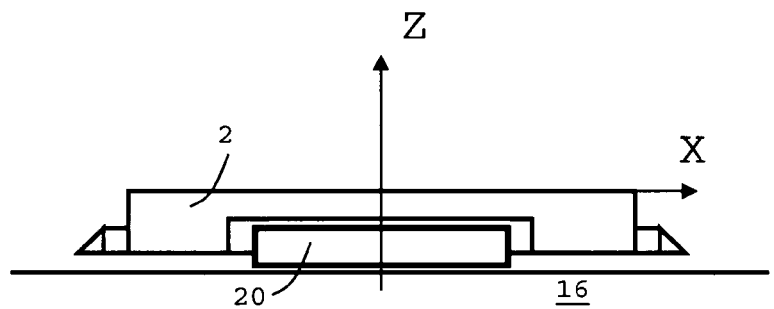
FIG. 3B shows a schematical side view of the actuator assembly of FIG. 3A.

In a lithographic apparatus according to an embodiment of the present invention, all actuators are included in one actuator assembly 20, as shown in FIGS. 3A and 3B. A frame 22 of the actuator assembly 20 is flexibly coupled to the object 2 via a flexible coupling assembly including a plurality of flexible coupling members 24. Due to the dynamical properties of such a configuration the actuator assembly 20 is provided with a better servo control stability and servo bandwidth, thereby enabling an improved actuator positioning performance. Further, the actuator assembly according to the embodiment of the present invention is more cost-effective, compared to a conventional actuator configuration. It will be appreciated that fewer mechanical parts are employed, thereby lowering material and labor costs. The configuration is also simpler, smaller and has less weight, resulting in a smaller center of gravity mismatch. The smaller mass enables larger scan accelerations resulting in a better throughput of wafers per hours.

Further, the flexible coupling members 24 may provide a better static accuracy. Due to the flexible coupling members 24, the actuator assembly 20 and the structures coupled to it are less sensitive to stresses in the structures, for example thermal stresses due to temperature changes. For example, using three leaf springs to attach the actuator assembly 20 to the object 2, the fixation is statically determined, while allowing large manufacturing tolerances, since the leaf springs may absorb any stresses due to the tolerances. Also, if the actuator assembly 20 heats during operation, its size may increase. Due to the flexible coupling members 24 providing a statically determined fixation, the fixation prevents that internal mechanical stresses may deform the actuator assembly 20 due to the coupling, or the object 2 coupled thereto.

In the embodiment of the present invention illustrated in FIGS. 3A and 3B, the actuator assembly frame 22 is flexibly coupled to the object 2 by a flexible coupling assembly including a plurality of flexible coupling members 24, such as leaf springs. The actuator assembly frame 22 is further coupled to a base structure 16 such as an apparatus base frame via actuators 26, 28. In operation, the actuators 26, 28 may move the actuator assembly frame 22 with respect to the base structure 16, thereby moving the object 2 with respect to the base structure 16.

The actuators 26, 28 are configured such that the object 2 may move in six degrees of freedom with respect to the base structure 16. In the illustrated embodiment, the actuator assembly 20 includes a set of actuators 26. For example, a magnet assembly of each actuator 26 is attached to the actuator assembly frame 22 and a corresponding coil assembly of the actuators 26 is coupled to the base structure 16. The actuators 26 may cooperate to move the object, e.g. a pattern support or a substrate table or "substrate support", in a plane, i.e. the object 2 may be translated and/or rotated in the plane, i.e. moved in three degrees of freedom. For example, the plane may be a horizontal x,y-plane, and thus the object 2 may be moved in an x-direction, a y-direction and may be rotated in a Rz-direction (around an axis perpendicular to the x-direction and perpendicular to the y-direction). However, the plane may be a horizontal plane, as indicated above, or in another embodiment it may be a vertical or any otherwise oriented plane.

The shown actuator assembly 20 further includes a set of actuators 28 coupled to the actuator assembly frame 22 and the base structure 16 and configured to move the object 2 substantially perpendicular to the above-mentioned plane. In general, an actuator 28 may move an object 2 along a line. In the shown embodiment, one actuator 28 may move the object 2 in a z-direction, thereby moving the object 2 substantially perpendicular to the x,y-plane. When using at least three of such z-actuators 28, the object 2 may be rotated in a Rx-direction and a Ry-direction and translated in the z-direction. It will be appreciated that the plane may be oriented in any direction and the set of actuators 28 may move the object 2 in a corresponding perpendicular direction.

Since the actuators 28 operate in a direction perpendicular to the plane of the actuators 26, the combination of the set of actuators 26 and the actuators 28 is configured to move the actuator assembly frame 22, and thereby object 2, in six degrees of freedom. Since the flexible coupling members 24 are the only coupling elements between the actuator assembly frame 22 and the object 2, the dynamical properties of the configuration differ from the dynamical properties of the conventional assembly illustrated in FIGS. 2A-2C. The main difference is illustrated in FIG. 3C.

Figure 3C:
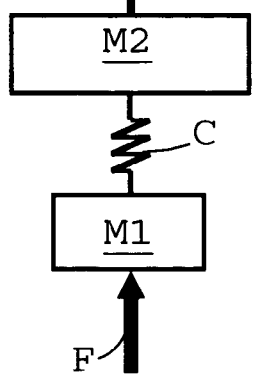
FIG. 3C shows a simplified representation of the actuator assembly of FIG. 3B.

FIG. 3C shows a simplified representation of the actuator assembly according to the present invention. The configuration of the mass M2 (the controlled object 2), the compliance C (flexible coupling between the actuator assembly 20 and the object 2). and the mass M1 (the actuator assembly 20) is basically similar to the representation of the conventional assembly as illustrated in FIG. 2C. In the assembly according to an embodiment of the present invention as illustrated in FIG. 3C, however, the force F is exerted on the mass M1 instead of the mass M2 (FIG. 2C). Thus, the force F is filtered by the compliance C before being exerted on the controlled mass M2, thereby resulting in different dynamical properties. The improvement with respect to the servo control of the assembly is described in more detail in relation to FIGS. 4A-6B. The illustrated Bode plots and Nyquist plot in FIGS. 4A-6B are the dynamical properties of an exemplary embodiment. For other embodiments, the resonance peaks may lie at other frequencies and may have different values for amplitude and/or phase.

Figure 4A:
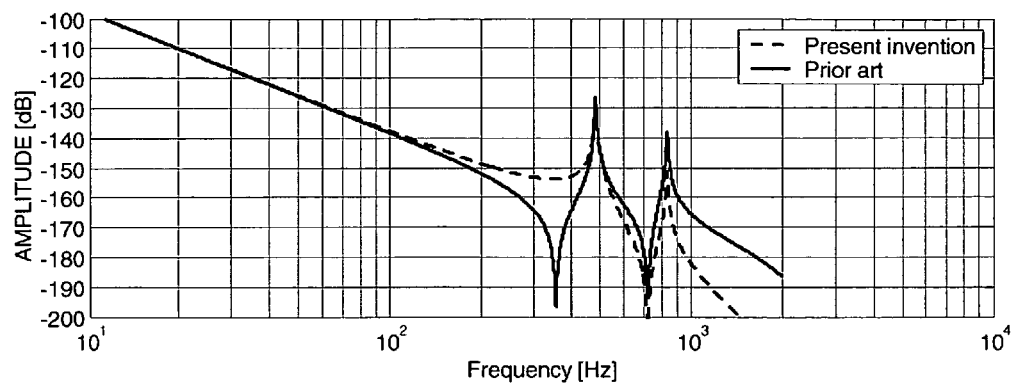
FIGS. 4A and 4B show a Bode plot of the dynamical properties of the actuator assembly of FIGS. 2A-2C and the actuator assembly of FIGS. 3A-3C.
Figure 4B:
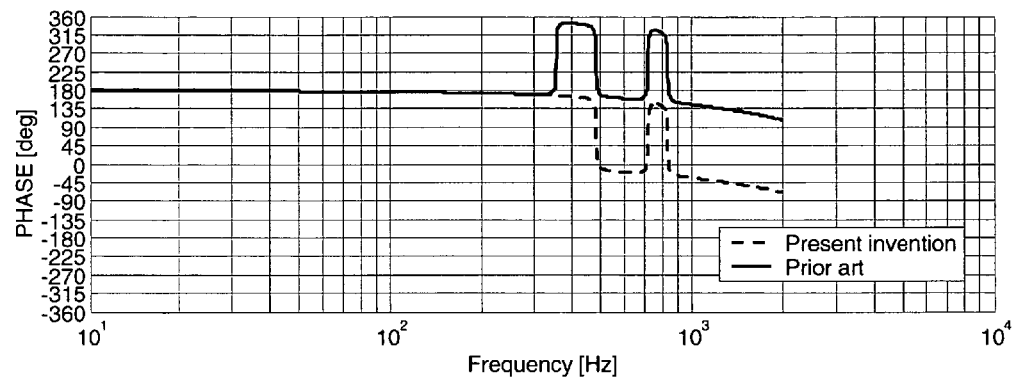

FIGS. 4A and 4B show a Bode plot for an exemplary embodiment of the conventional assembly configuration of FIGS. 2A-2C (solid line), and for an exemplary embodiment of the assembly configuration according to the embodiment of the present invention of FIGS. 3A-3C (dashed line). Referring to FIGS. 2A-2C, in the conventional configuration, the force F exerted by the second set of actuators acts upon the mass M2. In FIGS. 4A-4B, the corresponding Bode plot (solid line) of the vertical direction (Z) and open-loop mechanics for the mass M2 shows a number of resonance peaks (mechanical eigen frequencies). At about 500 Hz, a mechanical resonance corresponding to the compliance C is present. At about 800 Hz, there is a parasitic resonance. The amplitude of the Bode plot shows a −40 dB/dec roll off both before and after the resonance peaks.

Now referring to the mechanical system shown in FIG. 3C and the corresponding Bode plot (dashed line) in FIGS. 4A-4B, the amplitude of the assembly configuration according to the embodiment of the present invention lacks one anti-resonance peak (seen as a downward peak at about 330 Hz), but has the same resonance peak at 500 Hz due to the compliance C compared to the Bode plot for the conventional configuration (solid line). Further, after the resonance peak at 500 Hz, the amplitude shows a steep roll off of −80 dB/dec. Due to this steep roll off, the resonance peak at 800 Hz is about 15 dB lower compared to the conventional resonance peak at 800 Hz.

Figure 5A:
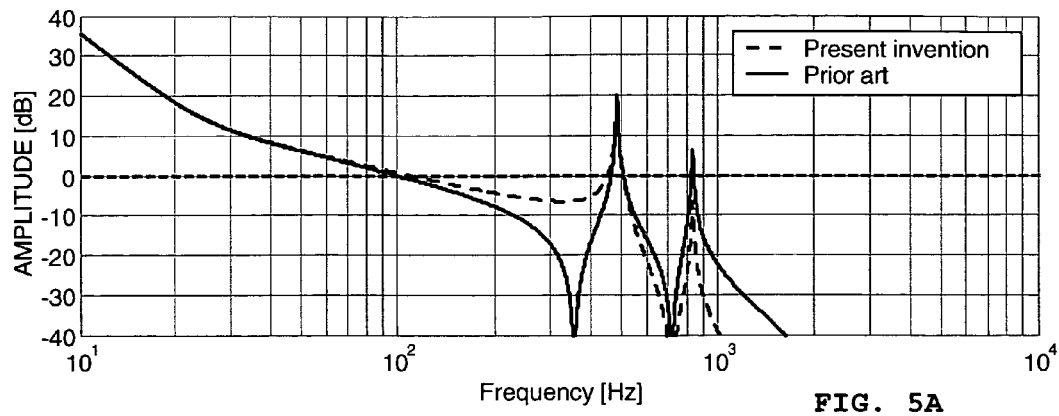
FIGS. 5A and 5B show a Bode plot of the dynamical properties of the PID low pass open loop controlled actuator assemblies of FIGS. 2A-2C and of FIGS. 3A-3C.
Figure 5B:
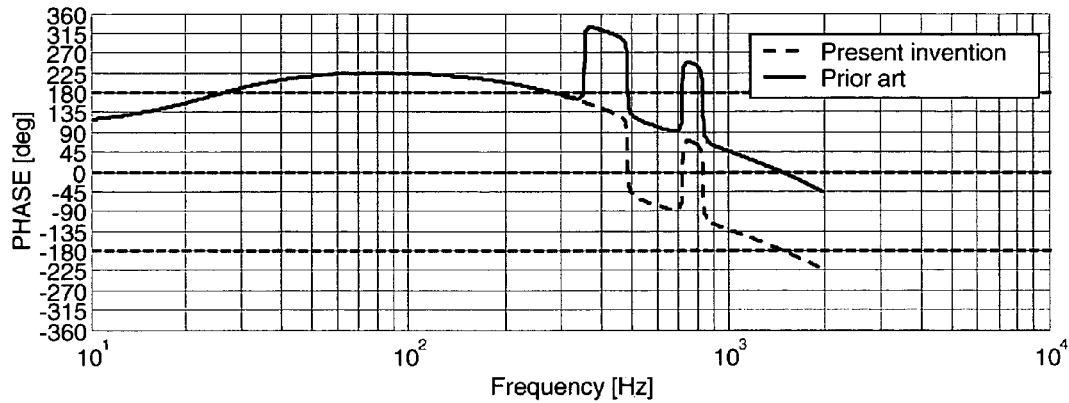
Figure 5C:
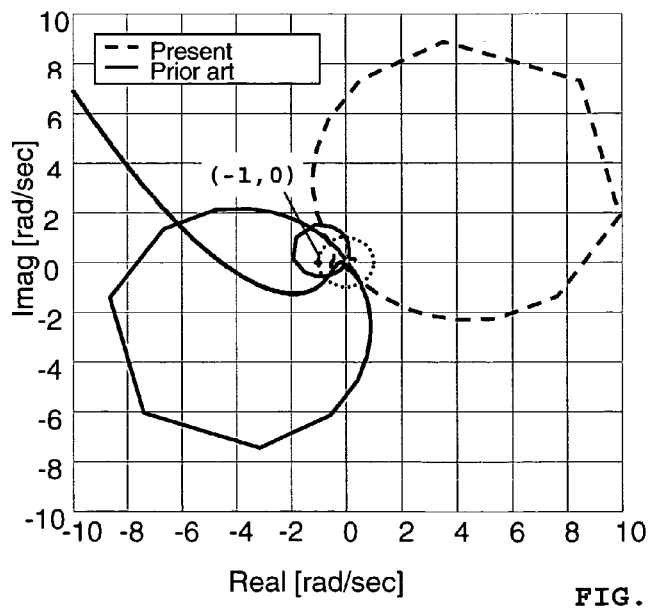
FIG. 5C shows a Nyquist plot corresponding to the dynamical properties shown in FIGS. 5A and 5B.

The steep roll off of the amplitude may be employed to obtain a larger bandwidth for the servo control loop. This effect on the PID low pass controlled open loop is shown in FIGS. 5A-5C. The Bode plot of the conventional assembly configuration, shown in FIGS. 5A-5B with a solid line, indicates four additional zero crossings in case the bandwidth is set at 100 Hz. The Nyquist plot of FIG. 5C further indicates that these zero crossings are unstable. Therefore, stability may be obtained for the conventional configuration by selecting the bandwidth at about 10-20 Hz.

For the assembly configuration according to the embodiment of the present invention, the Bode plot of FIGS. 5A-5B (dashed line) shows only two additional zero crossings in case the bandwidth is set at 100 Hz. The Nyquist plot of FIG. 5C indicates that these zero crossings are stable and thus no stability problem occurs. Thus, the target bandwidth of 100 Hz is obtained.

Figure 6A:
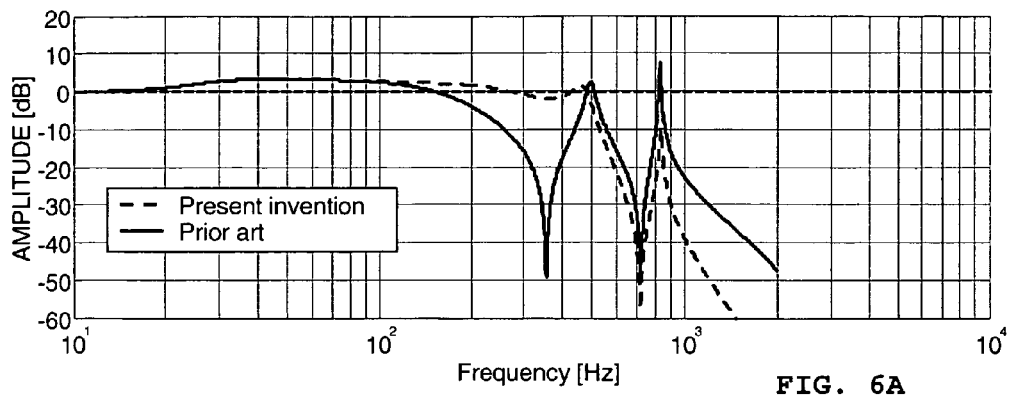
FIGS. 6 show a Bode plot of the dynamical properties of the PID low pass closed loop controlled actuator assemblies of FIGS. 2A-2C and of FIGS. 3A-3C.
Figure 6B:
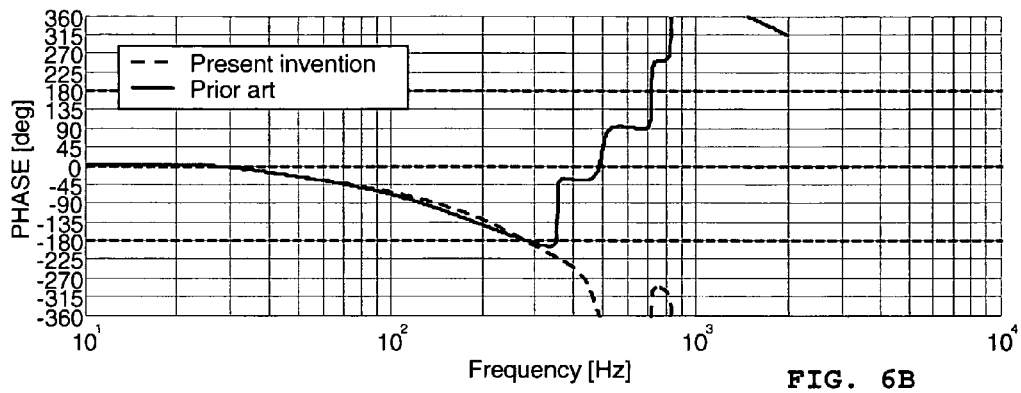

The Bode plots shown in FIGS. 6A-6B illustrate the closed loop dynamical properties of the above-described configurations. Again, the conventional assembly closed loop is unstable, whereas the closed loop according to the present invention is stable.

Figure 7:
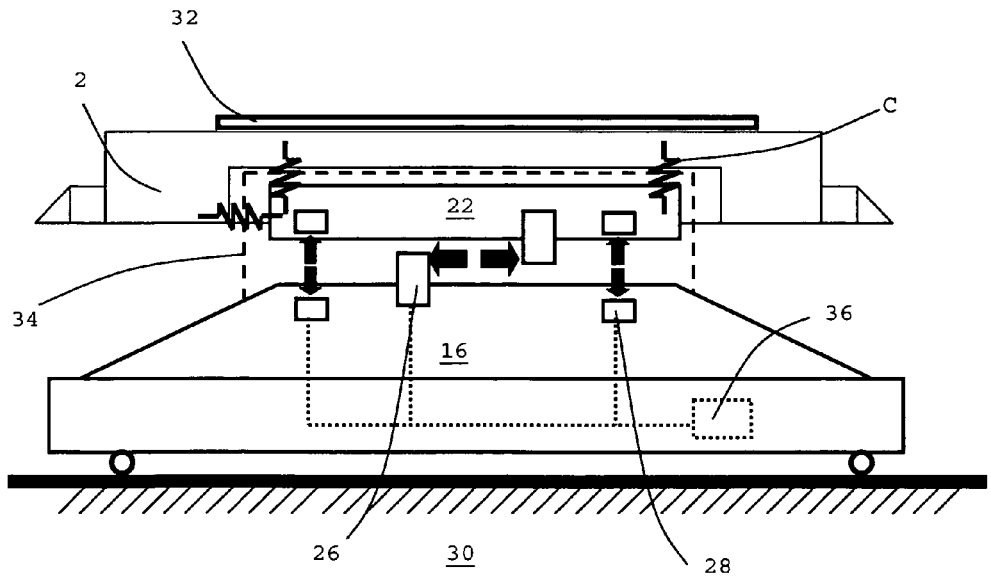
FIG. 7 schematically illustrates an actuator assembly according to an embodiment of the present invention.

FIG. 7 illustrates an exemplary embodiment of a substrate table according to an embodiment of the present invention. A base structure 16 is positioned on a floor or other support structure 30. An actuator assembly frame 22 is attached to the base structure 16 by a number of actuators 26, 28. The object 2 corresponding to the substrate table or "substrate support" is attached to the actuator assembly 20 by a flexible coupling assembly including a plurality of flexible coupling members as described in relation to FIGS. 3A-3B. In FIG. 7, a substrate 32 is positioned on the object 2 (i.e. the substrate table or "substrate support") and may be positioned with respect to any other structure or system, for example a projection system or a radiation beam generated by an illumination system.

When the actuators 26, 28 are operative, heat is generated in the actuators 26, 28. If the generated heat is absorbed by a structure, the structure may deform due to internal thermal stresses. The required accuracy for the lithographic method performed by the lithographic apparatus, however, is very high. Any deformation due to thermal stresses may deteriorate the accuracy of the apparatus. To minimize the influence of thermal stresses and a resulting deformation, the actuator assembly 20 may at least partly be shielded with a heat shield 34. Said heat shield 34 may prevent that heat generated by the actuators 26, 28 transfers to the base structure 30 or the substrate table 2, or any other surrounding structure. The heat shield 34 can be made of a good thermal conductor (e.g. aluminum) and/or may be directly water-cooled such as known from the prior art. Further, the actuator assembly 20 may advantageously be provided with a cooling system 36, such as a conventional water cooling system, to remove any generated heat, thus also preventing that the actuator assembly frame 22 heats up.

It is noted that the above-described embodiment may only be employed for moving an object over short distances. Due to the coupling of the actuators 26, 28 to the actuator assembly frame 22 a movement in the above mentioned plane may not exceed a distance of free movement in the direction of the actuators 28. Vice versa, a movement perpendicular to the plane may not exceed a distance of free movement in the direction the said actuators 26. For example, the above-mentioned magnet assembly and coil assembly are spaced apart. The space between the two assemblies may be employed to move. However, it lies within the ambit of the person skilled in the art to design an actuator assembly provided with a number of actuators configured to move an object in a number of degrees of freedom over longer distances by providing other kind of actuators and/or another coupling construction between an actuator and the base structure and/or the actuator assembly frame. Moreover, while the above embodiment is described to include a magnet assembly and a coil assembly, the actuators 26, 28 may be any suitable kind of actuators, planar or linear, electrically, hydraulically, pneumatically or otherwise actuated.

In the illustrated embodiments, the object is positioned above the actuator assembly. However, the present invention is not limited to such a configuration. The object may as well be positioned beside or below the actuator assembly. In any case, care should be taken that the object is supported by, but only flexibly coupled to the actuator assembly such that there is no other coupling between the object any other structure than the flexible coupling to the actuator assembly.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a pattern support configured to support a patterning device, the patterning device being configured to impart the radiation beam with a pattern in its cross-section to form a patterned radiation beam;
   a substrate support constructed to hold a substrate;
   a projection system configured to project the patterned radiation beam onto a target portion of the substrate; and
   an actuator assembly configured to move one of said supports with respect to a base structure, the actuator assembly comprising:
      an actuator assembly frame;
      a flexible coupling assembly configured to flexibly couple said actuator assembly frame to said one support, and
      a plurality of actuators that are each configured to couple said actuator assembly frame to said base structure and that are each configured to controllably exert a force on the actuator assembly frame, the plurality of actuators being configured to move said one support in three degrees of freedom in a plane and at least one other degree of freedom, wherein the plurality of actuators are connected to the actuator assembly frame such that movement of said support is effected by the plurality of actuators in the three degrees of freedom in a plane and the at least one other degree of freedom through the flexible coupling assembly.

2. The lithographic apparatus according to claim 1, wherein said actuator assembly comprises at least one planar actuator configured to move said one support in said plane and at least one actuator configured to move said support in said one other degree of freedom.

3. The lithographic apparatus according to claim 2, wherein said one other degree of freedom is directed substantially perpendicular to said plane.

4. The lithographic apparatus according to claim 1, wherein the actuator assembly is at least partly provided with a heat shield configured to prevent a heat transfer to said support.

5. The lithographic apparatus according to claim 1, wherein the actuator assembly further comprises a cooling system.

6. The lithographic apparatus according to claim 1, wherein said one support is the pattern support.

7. The lithographic apparatus according to claim 1, wherein said one support is the substrate support.

8. The lithographic apparatus according to claim 1, further comprising an actuator assembly configured to move the other of said supports so that both said pattern support and said substrate support are moved by a respective actuator assembly that each comprise an actuator assembly frame, a flexible coupling assembly and at least one actuator.

9. The lithographic apparatus according to claim 1, wherein the pattern support is a mask table.

10. The lithographic apparatus according to claim 1, wherein the substrate support is a substrate table.

11. The lithographic apparatus according to claim 1, wherein said flexible coupling assembly comprises a plurality of leaf springs.

12. The lithographic apparatus according to claim 1, wherein said flexible coupling assembly comprises a plurality of flexible coupling members.

13. The lithographic apparatus according to claim 12, wherein the flexible coupling members are equidistant to one another.

14. The lithographic apparatus according to claim 1, The lithographic apparatus according to claim 1, wherein said plurality of actuators include a magnet assembly arranged in said actuator assembly frame and a coil arranged in said base structure.

15. The lithographic apparatus according to claim 1, wherein the actuator assembly is configured to filter supporting forces that act to space apart said support from the base structure.

16. The lithographic apparatus according to claim 1, wherein the one support partly encloses the actuator assembly frame.

17. An apparatus comprising an actuator assembly constructed to support and move an object, the actuator assembly comprising:
   an actuator assembly frame;
   a flexible coupling assembly configured to flexibly couple said actuator assembly frame to said object, and
   a plurality of actuators that are each configured to couple said actuator assembly frame to a base structure and that are each configured to controllably exert a force on the actuator assembly frame, the plurality of actuators being configured to move said object in three degrees of freedom in a plane and at least one other degree of freedom, wherein the plurality of actuators are connected to the actuator assembly frame such that movement of said support is effected by the plurality of actuators in the three degrees of freedom in a plane and the at least one other degree of freedom through the flexible coupling assembly.

18. The apparatus according to claim 17, wherein said flexible coupling assembly comprises a plurality of leaf springs.

19. The apparatus according to claim 17, wherein said flexible coupling assembly comprises a plurality of flexible coupling members.

20. The apparatus according to claim 19, wherein the flexible coupling members are equidistant to one another.

21. The lithographic apparatus according to claim 17, wherein said plurality of actuators include a magnet assembly arranged in said actuator assembly frame and a coil arranged in said base structure.

22. The apparatus according to claim 17, wherein the plurality of actuators are arranged in the actuator assembly frame, such that movement of the object is effected by the plurality of actuators in the three degrees of freedom in a plane and the at least one other degree of freedom through the flexible coupling assembly.

* * * * *